(12) United States Patent
Liao

(10) Patent No.: US 7,625,217 B1
(45) Date of Patent: Dec. 1, 2009

(54) SOCKET WITH OPPOSITELY ARRAYED TERMINALS

(75) Inventor: Fang-Chu Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/288,235

(22) Filed: Oct. 17, 2008

(30) Foreign Application Priority Data

Jun. 16, 2008 (TW) ............... 97210596 U

(51) Int. Cl.
*H01R 12/00* (2006.01)
*H05K 1/00* (2006.01)

(52) U.S. Cl. ........................................ 439/66; 439/862

(58) Field of Classification Search ................. 439/66, 439/862, 91, 591
See application file for complete search history.

(56) References Cited

U.S. PATENT DOCUMENTS

| | | | | |
|---|---|---|---|---|
| 5,221,209 | A * | 6/1993 | D'Amico | 439/71 |
| 6,971,885 | B2 * | 12/2005 | Mowry | 439/66 |
| 7,044,746 | B2 * | 5/2006 | Copper et al. | 439/66 |
| 7,390,195 | B2 * | 6/2008 | Liao | 439/66 |
| 7,427,203 | B2 * | 9/2008 | Liao | 439/66 |
| 7,435,100 | B2 * | 10/2008 | Chang et al. | 439/66 |
| 7,479,015 | B2 * | 1/2009 | Ruttan et al. | 439/66 |
| 2005/0233606 | A1 * | 10/2005 | Liao et al. | 439/66 |
| 2006/0024987 | A1 * | 2/2006 | Huang et al. | 439/66 |
| 2007/0082513 | A1 * | 4/2007 | Zheng | 439/70 |
| 2007/0218764 | A1 * | 9/2007 | Chang et al. | 439/607 |

FOREIGN PATENT DOCUMENTS

CN 2779652 Y 5/2006

* cited by examiner

*Primary Examiner*—Hae Moon Hyeon
(74) *Attorney, Agent, or Firm*—Andrew C. Cheng; Wei Te Chung; Ming Chieh Chang

(57) ABSTRACT

A socket (100) adapted for electrically connecting a semiconductor package (200) and a PCB (300), comprises an insulating body (10) and a plurality of terminals (20) each having an elastic arm. The insulating body has a mating face (101), a mounting face (102) opposite to the mating face and a plurality of passageways (103) passing through the mating face and the mounting face. The insulating body is formed with a first and a second areas (1011, 1012) separated by a beeline (L1), the passageways are distributed on both of the areas. The terminals are received in the passageways, and extending directions of the terminals in a same area are uniform but opposite with that of the terminals in the other area. And the extending directions of all the terminals are parallel to the beeline.

15 Claims, 5 Drawing Sheets

SOCKET WITH OPPOSITELY ARRAYED TERMINALS

BACKGROUND OF THE INVENTION

1. Field of the Invention

The present invention relates to a socket, especially to a socket electrically connecting a semiconductor package and a printed circuit board.

2. Description of the Related Art

An LGA (Land Grid Array) socket, for electrically connecting a semiconductor package, comprises an insulating housing and terminals, the insulating housing is formed with a bottom wall and sidewalls extending from the bottom wall, the bottom wall and the sidewalls define a receiving space for receiving the semiconductor package, together. The terminal has a retaining portion mounted on the insulating housing, an elastic portion extending from the retaining portion and a soldering portion, a contacting portion is formed on an end of the elastic portion. The elastic portion is exposed beyond the bottom wall and received in the receiving space when the terminal is assembled, the soldering portion is used to solder to a printed circuit board. When the semiconductor package assembles to the socket, the semiconductor package contacts the contacting portion of the terminal and presses the elastic portion of the terminal, so electrically connection between the semiconductor package and the printed circuit board is achieved by the terminals. The elastic portion of this type terminal can distort to get a better contacting effect between the semiconductor package and the terminal.

However, the elastic portions of the terminals in such type socket are assembled toward a same direction, when the semiconductor package mounts and bears the terminals, the semiconductor package will be forced by elastic resistances generated by the elastic portions and toward one direction, which may cause worse contacting effects between the semiconductor package and some of the terminals and even may influence a contacting quality of the whole socket.

Chinese Patent Issue No. 2779652 publishes another socket, which comprises an insulating housing and a plurality of terminals received in the insulating housing. The insulating housing defines a plurality of receiving slots arranged in matrix, the terminals are accepted in the receiving slots, the terminal has an elastic arm and a contacting portion formed on an end of the elastic portion. The receiving slots arranged in matrix are distributed in at least two areas, and the terminals in the two areas are oppositely arrayed. The extending directions of the elastic portions of the terminals in a same area are uniform, and are opposite to that of the elastic portions of the terminals in the other area, respectively. This type of socket disposes the terminals in an opposite way, after the terminals are pressed, horizontal frictions of the terminals acting on the semiconductor package can be reduces, and even finally are balanced. However, this type socket has limitations which includes an assembly of the semiconductor package being not convenient, and a setting of the insulating housing to the printed circuit board being not convenient either.

Hence, it is required to improve the disadvantages of the above sockets.

SUMMARY OF THE INVENTION

An object of the invention is to provide a socket with oppositely arrayed terminals.

To achieve the above-mentioned object, a socket adapted for electrically connecting a semiconductor package to a printed circuit board, comprises an insulating body and a plurality of terminals. The insulating body has a mating face, a mounting face opposite to the mating face and a plurality of passageways passing through the mating face and the mounting face, the insulating body is formed with two areas separated by a beeline thereof, and the passageways distributed on both of the two areas. The terminals are received in the passageways, and each terminal has an elastic arm protruding out of the mating face of the insulating body. Extending directions of the elastic arms of the terminals in same area are uniform, and are opposite with that of the elastic arms of the terminals in the other area. And the extending directions of all the terminals are parallel to the beeline.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Referring to FIGS. 1-5, a socket 100 in accordance with a preferred embodiment of present invention is disclosed for electrically connecting a semiconductor package 200 to a PCB (printed circuit board) 300. The socket 100 has an insulating body 10 and a plurality of terminals 20 received in the insulating body 10.

Figure 2:
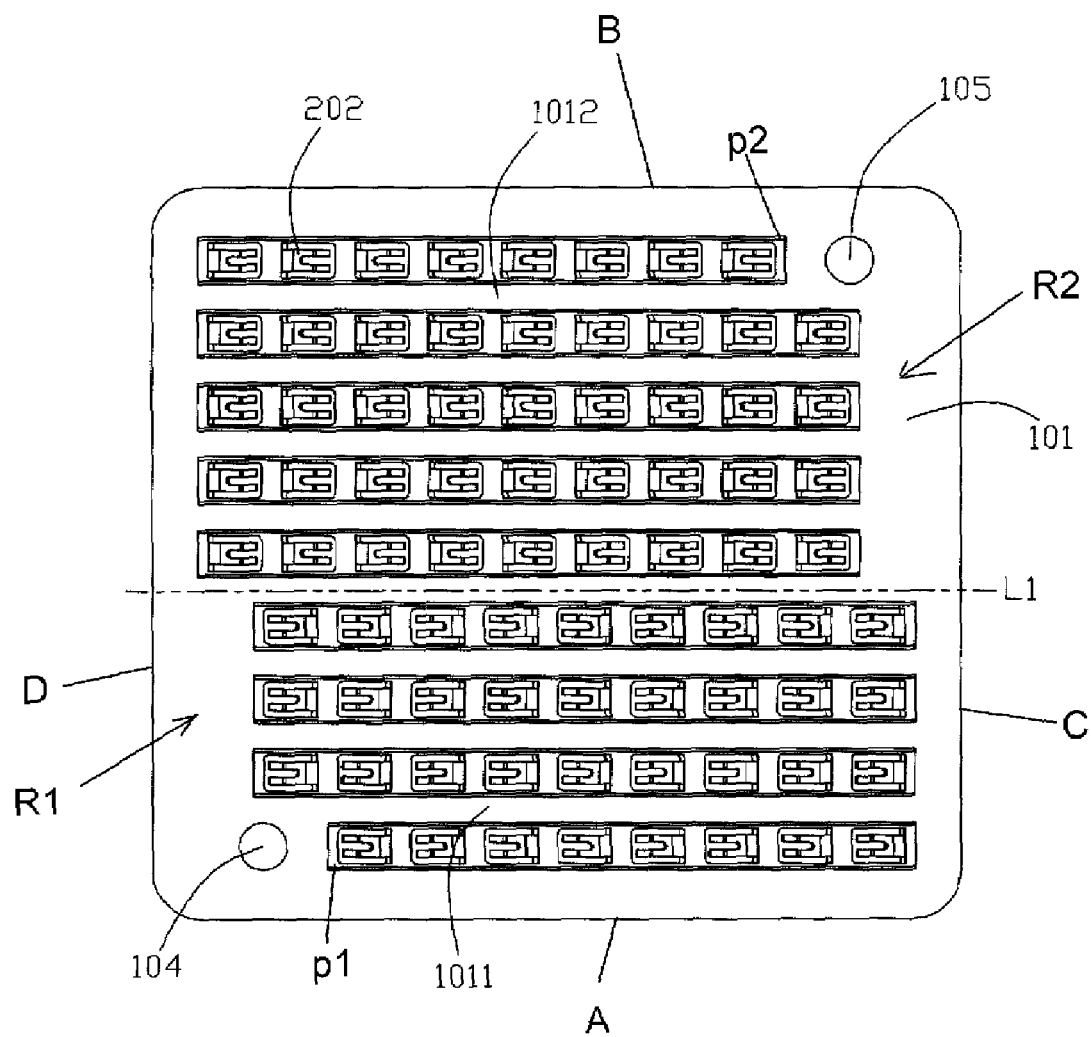
FIG. 2 is a top view of the socket in accordance with a preferred embodiment of present invention.

The insulating body 10 is a rectangle board-like, and defines a mating face 101, a mounting face 102 opposite to the mating face and a plurality of passageways 103 extending through the mating face 101 and the mounting face 102 and arranged in matrix for receiving the terminals 20. The insulating body 10 is formed with two arrears: a first area 1011 and a second area 1012, along a beeline L1. The first area 1011 and the second area 1012 are both in approximately rectangle shape, and define a first position hole 104 and a second position hole 105, respectively, for engaging with the semiconductor package 200. The first and the second holes 104, 105 extend through the insulating body 10, and occupy two opposite corners of the insulating body 10, respectively. Referring to FIG. 2, the passageways 103 in two adjacent lines of the first and the second areas 1011, 1012 respectively are arranged in stagger way.

The terminal 20 has a retaining base portion 201, an elastic arm 202 upwardly bended from a side of the base portion 201 and a contacting arm 203 downwardly extending from the base portion 201. The base portion 201 can reliably latch with the passageway 103, so that the terminal 20 can be retained in the passageway 103. An end of the elastic arm 202 is disposed into fork-shape with two distant contacting portions 2021.

And an end of the contacting arm 203 is also disposed into fork-shape with two distant mating portions 2031. The base portion 201 has two retaining arms (not labeled) vertically and downwardly extending from the base portion 201.

Figure 1:
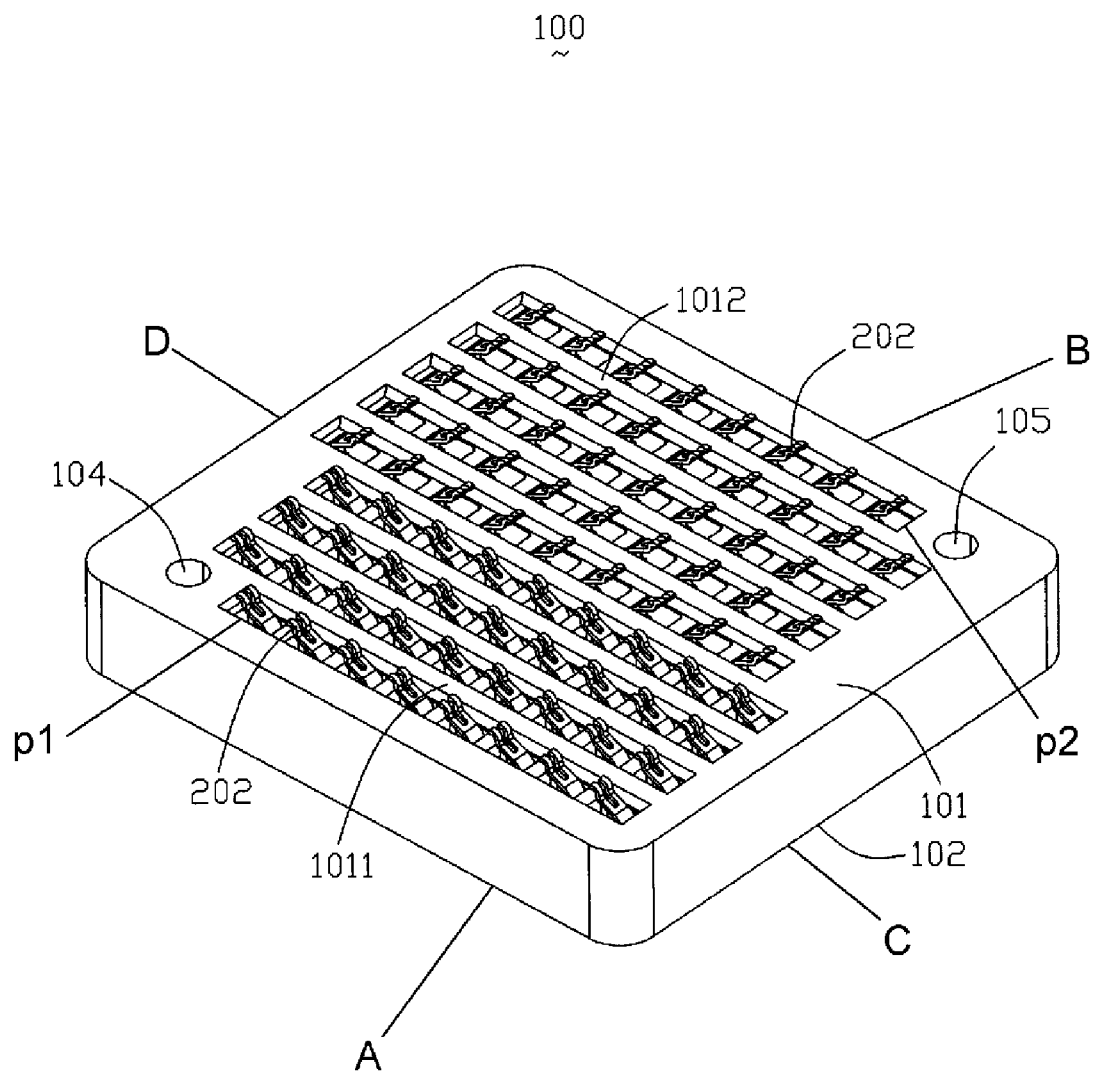
FIG. 1 is an assembled, perspective view of a socket in accordance with a preferred embodiment of present invention.

Referring to FIGS. 1 and 2, the terminals 20 are received in the passageways 103 of the insulating body 10 in following manner: the terminals 20 in the first area 1011 and the terminals 20 in the second area 1012 are oppositely arrayed, and extending directions of the elastic arms 202 of the terminals 20 in a same area, such as the first area 1011 (the second area 1021) are uniform, toward left (right) in FIG. 2, and opposite with that of the elastic arms 202 of the terminals 20 in the second area 1021 (the first area 1011). Furthermore the elastic arms 202 will not interfere with the first position hole 104 or the second position hole 105. In this prefer embodiment, the extending directions of the elastic arms 202 of all the terminals 20 are parallel with the beeline L1 of the insulating body 10.

Figure 3:
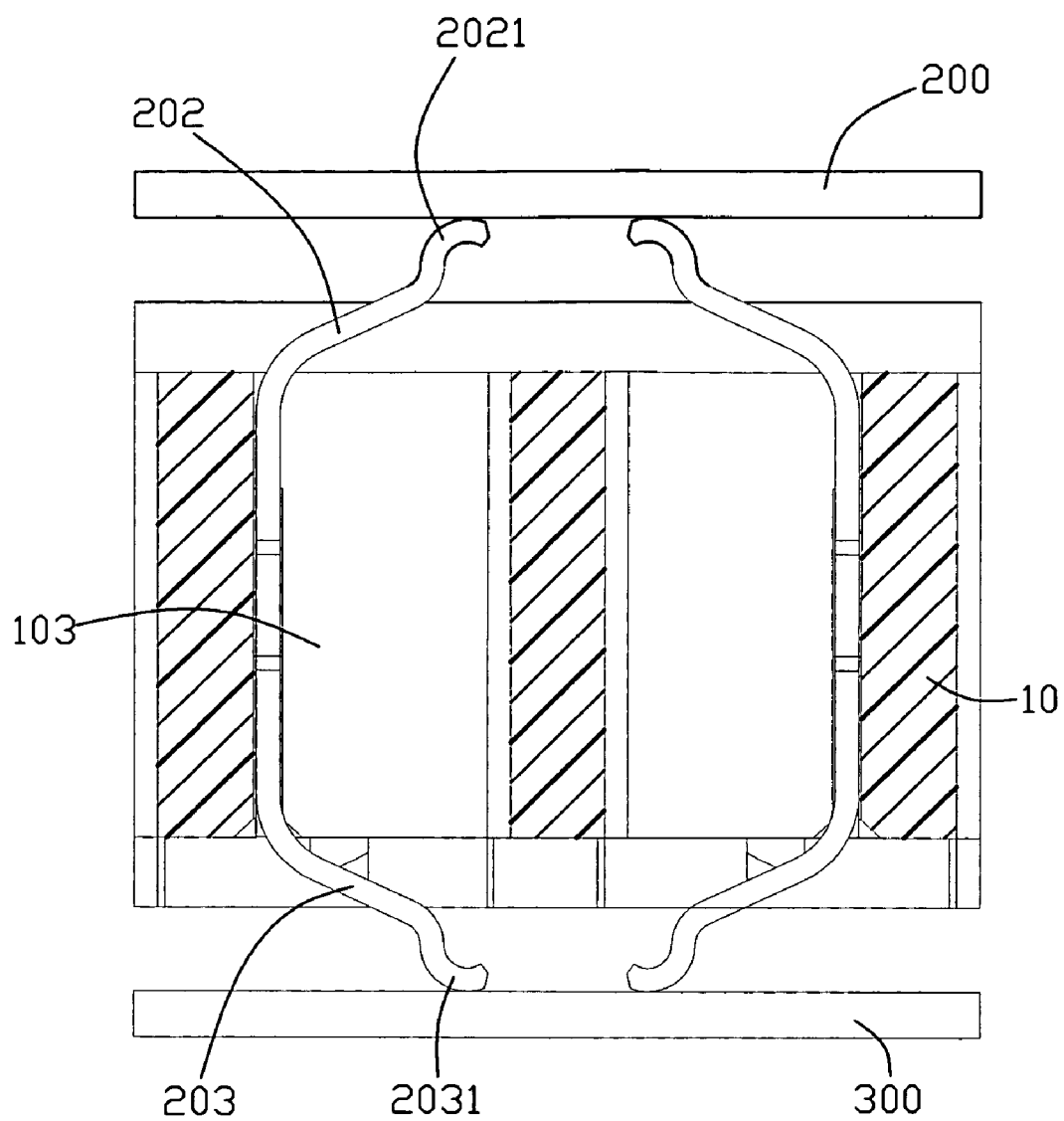
FIG. 3 is a partially, section view of the socket in accordance with a preferred embodiment of present invention, wherein the socket is disposed between a semiconductor package and a printed circuit board.
Figure 4:
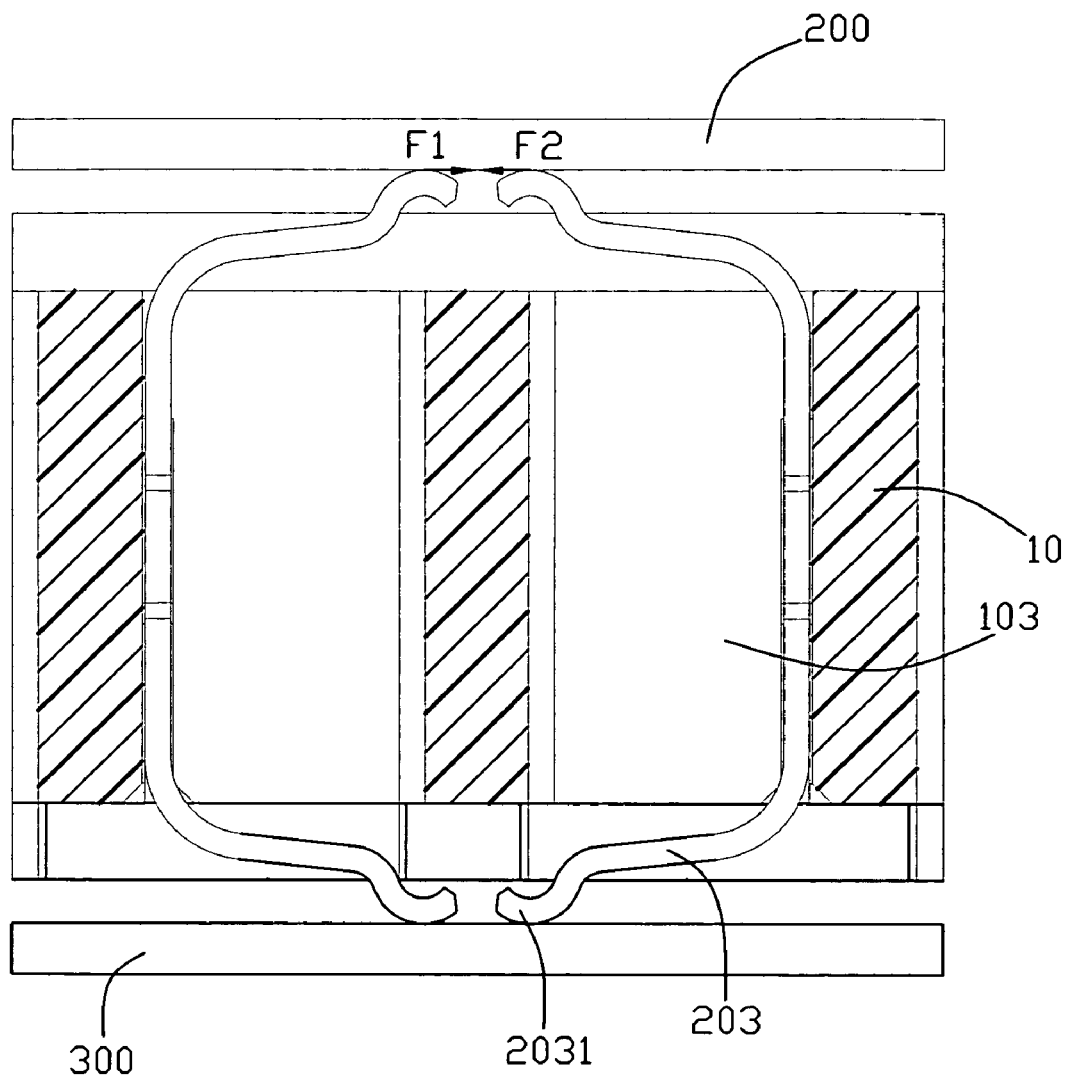
FIG. 4 is similar with the FIG. 3, but two terminals in the socket are pressed by the semiconductor package.
Figure 5:
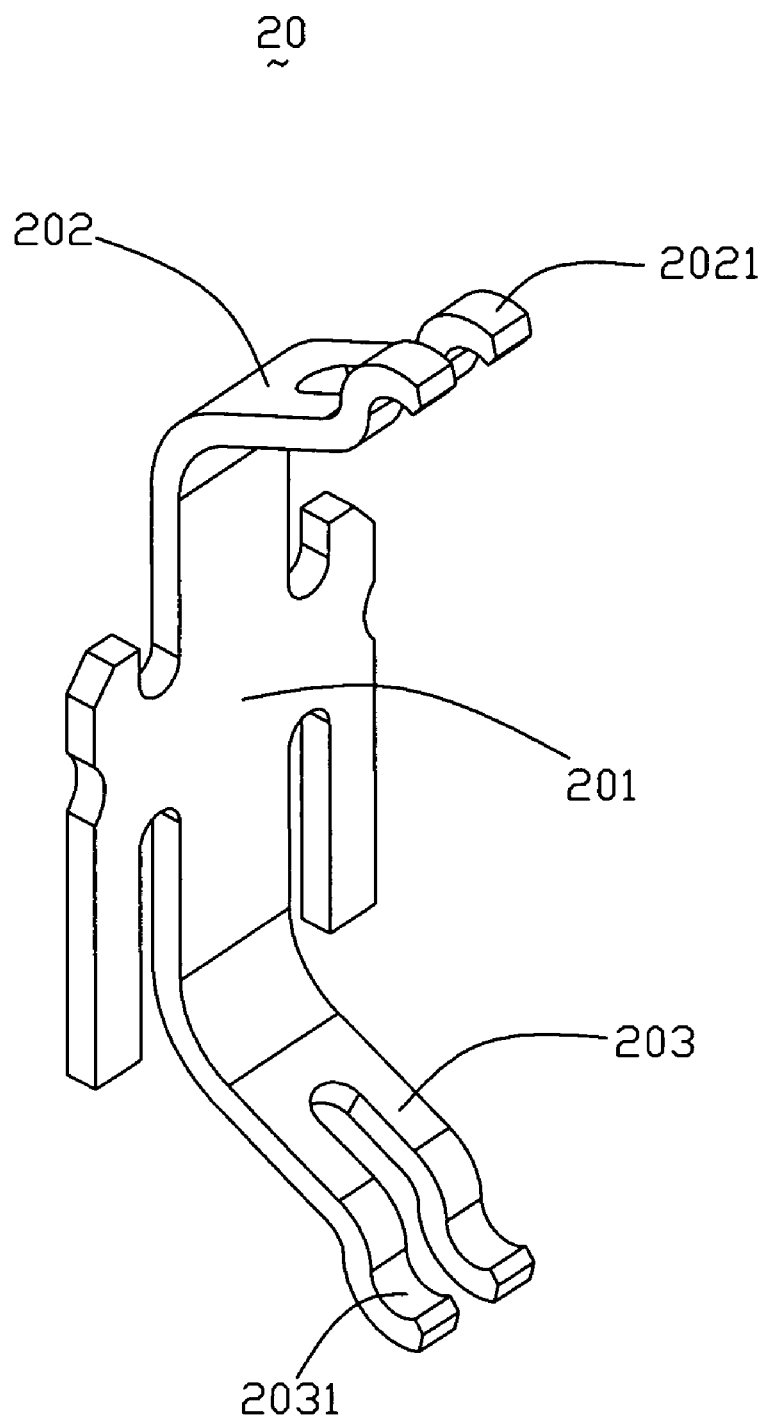
FIG. 5 is a perspective view of the terminal.

Referring to FIG. 3 and FIG. 4, which is a partial, section view showing two adjacent terminals 20 in the first area 1011 and the second area 1021, respectively, and on two sides of the beeline L1. The insulating body 10 is disposed between the semiconductor package 200 and the PCB 300. Before the semiconductor package 200 downwardly moves, the elastic arm 202 of the terminal 20 protrudes out of the mating face 101 of the insulating body 10, the mating portion 2031 of the contacting arm 203 mates with the PCB 300, neither the elastic arm 202 nor the contacting arm 203 distorts at this time; and then the semiconductor package 200 downwardly presses (referring to FIG. 4) the terminals 20. The elastic arms 202 of the terminals 20 in both the two areas 1011, 1021 are pressed to distort and generate horizontal and opposite frictions F1, F2, which can counteract an effect of each other, so a total horizontal friction of all the terminals 20 acting on the semiconductor package 200 is reduced, even gets balanceable. Synchronously, a horizontal movement of the semiconductor package 200 relative to the insulating body 10 caused by friction is lightened.

The first position hole 104 and the second position hole 105 which both extend through the insulating body 10, can engage with the PCB 300 to facilitate the insulating body 10 mounting to the printed circuit board 300.

From another view point, in the instant embodiment the insulative body 10 being of a rectangular contour having first and second lengthwise edges A, B and first and second transverse edges C, D alternately perpendicular with one another in sequence along lengthwise and transverse directions, respectively. The first position hole 104 and the second position hole 105 are formed around opposite first and second corners of the body 10 and defining therebetween a line around at forty-five degrees with regard to those four edges. The passageways 103 are arranged essentially in an N×N manner except that two of the passageways 103 around the first and second opposite corners are replaced by the first position hole 103 and the second position hole 105. Each of the passageways 103 defines a rectangular configuration having a long side and a short side in a top view to receive the corresponding contact 20 having an elastic arm 202 extending along the long side and parallel to the lengthwise direction. The passageway 103 are divided by the beeline L1, which extends along the lengthwise direction, into first and second groups wherein the first position hole 104 belongs the first group and the second position hole 105 belongs to the second group. The elastic arms 202 of the corresponding contacts 20 in the corresponding passageways 103 of the first group direct toward the second transverse edge D, and the elastic arms of the corresponding contacts 20 in the corresponding passageways 103 of the second group direct toward the first transverse edge C.

The first position hole 104 and the corresponding elastic arm 202 in the neighboring passageway p1 in the same lengthwise row do not interfere with each other in the top view, and the second position hole 105 and the corresponding elastic arm 202 in the neighboring passageway p2 in another same lengthwise row do not interfere with each other either n the top view. The passageways 103 located in the outermost transverse row of the first group and being far away from the first position hole 104, are closer to the first transverse edge C than the passageways 103 in another outermost transverse row of the second group which are essentially aligned with the second position hole 105. On the other hand, the passageways 103 located in an outermost transverse row of the second group and being far away from the second position hole 105, are closer to the second transverse edge D than the passageways 103 in another outermost transverse row of the first group which are essentially aligned with the first position hole 104.

The passageways 103 in the first group and those in the second group are essentially offset away from each other in the lengthwise direction so as to form a first unused area R1 in the first group closer to the second transverse edge and a second unused area R2 in the second group closer to the first transverse edge, thus resulting in an asymmetric arrangement of all said passageways 103 of said first group and said second group in the lengthwise direction.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket adapted for electrically connecting a semiconductor package to a printed circuit board, comprising:
an insulating body having a mating face, a mounting face opposite to the mating and a plurality of passageways passing through the mating face and the mounting face, the insulating body formed with two areas separated by a beeline, the passageways distributed on both of the two areas, the insulating body defining two position holes on two diagonal corners thereof; and
a plurality of terminals received in the passageways and each having an elastic arm protruding out of the mating face of the insulating body, extending directions of the elastic arms of the terminals in same area being uniform and toward the corresponding position hole, and being opposite with that of the elastic arms of the terminals in the other area, and the extending directions of all the elastic arms of the terminals being parallel to the beeline.

2. The socket as described in claim 1, wherein the first area and the second area are in rectangle shape.

3. The socket as described in claim 2, wherein the passageways in two adjacent lines of the first and the second areas respectively are arranged in stagger way.

4. The socket as described in claim 1, wherein the two position holes are used for engaging with the printed circuit board.

5. The socket as described in claim 4, wherein the terminal has a base potion for retaining the terminals in the passageway and a contacting arm downwardly extending from the base portion, the elastic arm is upwardly bent from the base portion.

6. The socket as described in claim 5, wherein an end of the elastic arm is disposed in fork-shape with two distant contacting portions for contacting with the semiconductor package, and an end of the contacting arm is also disposed in fork-shape with two distant mating portions for contacting with the printed circuit board.

7. The socket as described in claim 6, wherein the base portion has two retaining arms vertically and downwardly extending from the base portion.

8. A socket adapted for electrically connecting a semiconductor package to a printed circuit board, comprising:
   an insulating body having a mating face, a mounting face opposite to the mating and a plurality of passageways passing through the mating face and the mounting face; and
   a plurality of terminals having an elastic arm protruding out of the mating face of the insulating body, all the terminals received in the passageways and divided into two groups by a beeline, the elastic arms of the terminals being parallel to the beeline and toward two opposite directions for being in different groups.

9. The socket as described in claim 8, wherein the passageways in two adjacent lines of the two groups respectively are arranged in stagger way.

10. The socket as described in claim 8, wherein the insulating body has two position holes defined on two diagonal corners of the insulating body for engaging with the printed circuit board.

11. The socket as described in claim 10, wherein the terminals in each group are arranged in lines, and one of the lines aligned with the position hole has a less terminal amount relative to the other lines in a same group for leaving a place for the position hole.

12. The socket as described in claim 10, wherein the terminal has a base potion for retaining the terminals in the passageway and a contacting arm downwardly extending from the base portion, the elastic arm is upwardly bended from the base portion.

13. The socket as described in claim 12, wherein an end of the elastic arm is disposed in fork-shape with two distant contacting portions for contacting with the semiconductor package, and an end of the contacting arm is also disposed in fork-shape with two distant mating portions for contacting with the printed circuit board.

14. The socket as described in claim 13, wherein the base portion has two retaining arms vertically and downwardly extending from the base portion.

15. A socket for use with an electronic package comprising:
   an insulative body being of a rectangular contour having first and second lengthwise edges and first and second transverse edges alternately perpendicular with one another in sequence along lengthwise and transverse directions, respectively;
   first and second position holes formed around opposite first and second corners of the body and defining therebetween a line around at a forty-five degrees with regard to said four edges;
   a plurality of passageways formed in the body and arranged essentially in an N×N manner except that two of said passageways around said opposite first and second corners are replaced by said pair of position holes,
   each of said passageways defining a rectangular configuration having a long side and a short side in a top view to receive a corresponding contact having an elastic arm extending along said long side and parallel to the lengthwise direction, the passageways being divided into first and second groups via a beeline which extends along the lengthwise direction wherein the first position hole belongs to the first group and the second position hole belongs to the second group, the elastic arms in the corresponding passageways of said first group directing toward the second transverse edge and those in the corresponding passageways of the second group directing toward the first transverse edge under condition of having the first position hole and the corresponding elastic arm in the neighboring passageway in a same lengthwise row not to interfere with each other in said top view, and having the second position hole and the corresponding elastic arm in the neighboring passageway in another same lengthwise row not to interfere with each other in said top view;
   the passageways in an outermost transverse row of said first group and being far away from the first position hole, being closer to the first transverse edge than those in another outermost transverse row of the second group and essentially aligned with the second hole, the passageways in an outermost transverse row of said second group and being far away from the second position hole, being closer to the second transverse edge than those in another outermost transverse row of the first group and essentially aligned with the first position hole; wherein
   the passageways in the first group and those in the second group are essentially offset away from each other in the lengthwise direction so as to form a first unused area in the first group closer to the second transverse edge and a second unused area in the second group closer to the first transverse edge, thus resulting in an asymmetric arrangement of all said passageways of said first group and said second group in the lengthwise direction.

* * * * *